(12) United States Patent
Kato

(10) Patent No.: US 6,438,021 B2
(45) Date of Patent: Aug. 20, 2002

(54) METHODS OF READING AND WRITING DATA FROM/ ON SEMICONDUCTOR MEMORY DEVICE, AND METHOD FOR DRIVING THE DEVICE

(75) Inventor: Yoshihisa Kato, Shiga (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/800,478

(22) Filed: Mar. 8, 2001

(30) Foreign Application Priority Data

Mar. 9, 2000 (JP) ........................................ 2000-064925

(51) Int. Cl.[7] ............................................. G11C 11/22
(52) U.S. Cl. ...................................... 365/145; 365/149
(58) Field of Search .................................. 365/145, 149

(56) References Cited

U.S. PATENT DOCUMENTS

| | | | | |
|---|---|---|---|---|
| 5,446,688 A | * | 8/1995 | Torimaru | 365/145 |
| 5,515,311 A | | 5/1996 | Mihara | |
| 5,753,946 A | * | 5/1998 | Naiki et al. | 365/145 |
| 5,856,688 A | | 1/1999 | Lee et al. | |
| 6,067,244 A | * | 5/2000 | Ma et al. | 365/145 |
| 6,094,369 A | * | 7/2000 | Ozawa et al. | 365/145 |
| 6,191,441 B1 | * | 2/2001 | Aoki et al. | 365/145 |
| 6,233,169 B1 | * | 5/2001 | Nishimura | 365/145 |

FOREIGN PATENT DOCUMENTS

| | | |
|---|---|---|
| DE | 198 40 824 C1 | 10/1999 |
| JP | 05-205487 | 8/1993 |
| JP | 05-206411 | 8/1993 |

OTHER PUBLICATIONS

European Search Report, Date: Jul. 4, 2001.
S.L. Miller et al., "Modeling ferroelectric capacitor switching with asymmetric nonperiodic input signals and arbitrary initial conditions", Journal of Applied Physics, 70(5), pp. 2849–2860, Sep. 1991.
T. Nakamura et al., "Electrical Characteristics of MFMIS FET Using STN Fi.ms", Technical Report of IEICE, ED98–255, SDM98–208, pp. 63–69, Feb. 1999.

\* cited by examiner

*Primary Examiner*—Trong Phan
(74) *Attorney, Agent, or Firm*—Nixon Peabody LLP; Donald R. Studebaker

(57) ABSTRACT

In a semiconductor memory device in which a ferroelectric capacitor is connected to the gate of a field effect transistor (FET), a gate charge at the threshold voltage (Vti) of the FET is represented as Qti. In a polarization-voltage characteristic exhibited by the ferroelectric capacitor where a voltage applied thereto starts to be increased on the supposition that a polarization of 0 C/cm$^2$ initially exists in the capacitor, a voltage, associated with a polarization value corresponding to Qti, is represented as Vtf. In a read operation, the intersection between the gate charge-gate voltage characteristic of the FET and the polarization-voltage characteristic of the ferroelectric capacitor is the operating point where a worst-case polarization of 0 C/cm$^2$ exists in the capacitor after data has been retained in the capacitor. By applying a voltage Vtf+ Vti to the control electrode, the data can be read out correctly until the polarization decreases to reach 0 C/cm$^2$.

6 Claims, 10 Drawing Sheets

| OPERATION | BL | WL1 | WL2 | SL | SUBSTRATE |
|---|---|---|---|---|---|
| "1"WRITE | x | 5V | 3V | 0V | 0V |
| "0"WRITE | x | 5V | 0V | 3V | 3V |
| READ | 0.3V | 5V | 0.3V | 0V | 0V | x:FLOATING OR 0V

METHODS OF READING AND WRITING DATA FROM/ ON SEMICONDUCTOR MEMORY DEVICE, AND METHOD FOR DRIVING THE DEVICE

BACKGROUND OF THE INVENTION

The present invention relates to a nonvolatile memory device, in which a ferroelectric capacitor is connected in series to the gate electrode of a field effect transistor (FET).

A ferroelectric FET (FeFET) is a nonvolatile memory device including a ferroelectric and an FET in combination. An FeFET may have any of various types of device structures, which can be roughly classified into the categories of: MFS FeFETs; MFIS FeFETs and MFMIS FeFETs. As used herein, "MFS", "MFIS" and "MFMIS" are the acronyms standing for metal-ferroelectric-semiconductor, metal-ferroelectric-insulator-semiconductor and metal-ferroelectric-metal-insulator-semiconductor, respectively.

FIG. 9 is a cross-sectional view illustrating a structure for an MFMIS FeFET for use in the present invention. As shown in FIG. 9, the MFMIS FeFET has a multilayer structure consisting of dielectric 34, floating gate electrode 35, ferroelectric 36 and control electrode 37 that have been stacked in this order on a p-type silicon (Si) substrate 31. In the p-type Si substrate 31, a pair of n-type heavily doped regions 32 and 33 has been defined as source and drain electrodes, respectively. In this structure, a ferroelectric capacitor has been formed on the floating gate electrode 35 of an FET, and the electrode 35 is used in common for the ferroelectric capacitor and FET. A structure, in which the electrode of a ferroelectric capacitor is connected to the gate electrode of an FET through a line, is also a type of MFMIS FeFET.

Next, it will be described how an MFMIS FeFET with such a structure operates as a nonvolatile memory device.

When a voltage Vg applied to the control electrode has its polarity inverted into a positive or negative value, the direction of polarization in the ferroelectric reverses. In the following description, to apply a positive voltage Vg to the control electrode will mean to write data "1" on the ferroelectric, while to apply a negative voltage Vg to the control electrode will mean to write data "0" on the ferroelectric.

Even after the voltage applied has been removed from the control electrode to allow the electrode to be floating, the polarization is left in the ferroelectric, which is called "remanent polarization". To read data out, a voltage is applied between the source/drain electrodes while allowing the control electrode to be floating. In this state, the potential level at the control electrode is believed to be close to the ground level, because there is a leakage current flowing due to the existence of resistive components and because there is also a coupling capacitance created between the electrode and a line connected thereto. On the other hand, the potential level at the floating gate electrode of the FET may be either positive or negative depending on the direction of remanent polarization existing in the ferroelectric capacitor. If the potential level at the floating gate electrode is positive and higher than the threshold voltage of the FET, then the FET turns ON, thus allowing a current to flow between the source and drain regions. Alternatively, if the potential level at the floating gate electrode is negative, then the FET turns OFF and no source-drain current flows. By comparing a source-drain current value Ids with a predetermined reference current value Iref and defining Ids>Iref and Ids<Iref as representing data "1" and data "0", respectively, the data written can be read out accurately.

By way of an illustrative example, a simulation will be run on the operation of an MFMIS FeFET that uses strontium bismuth tantalate ($SrBi_2Ta_2O_9$) as its ferroelectric and silicon dioxide ($SiO_2$) as its dielectric, respectively.

FIG. 10 illustrates an equivalent circuit for the FeFET.

Now it will be described with reference to FIG. 10 how the MFMIS FeFET operates. In FIG. 10, the ferroelectric capacitor, FET and control, source and drain electrodes are identified by the reference numerals 41, 42, 43, 44 and 45, respectively.

The parameters are set as follows. Suppose the $SrBi_2Ta_2O_9$ has a thickness of 200 nm, a dielectric constant of 300 and a coercive voltage of 0.8 V, while the $SiO_2$ has a thickness of 3.5 nm and a dielectric constant of 3.9. The ferroelectric capacitor, which is the MFM section of the MFMIS structure, has a polarization Pf and an interelectrode voltage Vf and is supplied with a voltage Vg at the control electrode thereof. As for the FET, or the MIS section of the MFMIS structure, a charge Qi has been stored in the gate, voltages Vd, Vi and Vs (where Vs=0 V) are applied to the drain, floating gate and source electrodes, respectively, and the potential level at the substrate is 0 V. And when the FET alone is operated by electrically disconnecting the ferroelectric capacitor from the FET, the threshold voltage vti of the FET is supposed to be 0.5 V.

A memory cell like this meets the following two Equations (1) and (2):

$$Pf(Vf)=Qi(Vi) \quad (1)$$

$$Vg=Vf+Vi \quad (2)$$

combining these Equations (1) and (2) together, the following Equation (3)

$$Pf(Vf)=Qi(Vg-Vf) \quad (3)$$

is derived.

FIG. 11A illustrates a Pf–Vf characteristic (which is a so-called "hysteresis loop") of the ferroelectric capacitor. In FIG. 11A, Pf values corresponding to increasing voltages are represented by the lower curve 1, while Pf values corresponding to decreasing voltages are represented by the upper curve 2. A voltage, at which Pf=0 $C/cm^2$ in the Pf–Vf characteristic, is called a "coercive voltage Vc".

FIG. 11B illustrates a Qi–Vi characteristic of the FET as a curve 51. This characteristic can be easily obtained by a well-known computation method for an MOS capacitor.

By performing a symmetry transformation on this Qi–Vi characteristic about the Qi axis and shifting the resultant curve by Vg along the Vi axis, a Qi–(Vg–Vf) characteristic can be obtained. Thereafter, the Pf–Vf and Qi–(Vg–Vf) characteristics are plotted on the same graphic plane to obtain their intersection. As can be seen from Equation (3), this intersection represents the operating point of the FeFET. Supposing the voltage at the intersection is identified by Vx, Vf=Vx and Vi=Vg–Vx.

The operation of the FeFET will now be simulated by an operating point analysis technique using this graph.

First, it will be analyzed where the operating point is located when data "1" is written, i.e., a positive voltage Vg (>0 V) is applied to the control electrode. FIG. 12A illustrates a Pf–Vf characteristic 1 and 2 and a Qi–(Vg–Vf) characteristic 52 where a voltage Vg of 15 V is applied to the control electrode. As shown in FIG. 12A, the voltage Vx at the intersection 53 is 3 V, and vf=3 V. Accordingly, Vi=12 V is obtained by Equation (2).

Next, it will be analyzed where the operating point is located when data "0" is written, i.e., a negative voltage vg (<0 V) is applied to the control electrode. FIG. 12B illustrates a Pf–Vf characteristic 1 and 2 and a Qi–(Vg–Vf) characteristic 54 where a voltage vg of −15 V is applied to the control electrode. As shown in FIG. 12B, the voltage Vx at the intersection 55 is −3.5 V, and Vf =−3.5 V. Accordingly, Vi=−11.5 V is obtained by Equation (2).

If data is saved in such a state, the control electrode is floating. However, there is a voltage drop due to a leakage current flowing through the ferroelectric and FET and there is also a coupling capacitance between the electrodes. For that reason, the control electrode voltage Vg is believed to be almost 0 V. Thus, the following discussion will be based on the supposition that Vg=0 V (Vi=Vg−Vx≈−Vx) while the control electrode is floating.

FIG. 13 illustrates a Pf–Vf characteristic 1 and 2 and a Qi–(Vg–Vf) characteristic 56, which represent the operation state of the device on which data is retained. The operating point is determined by the hysteresis characteristic to be exhibited by the ferroelectric after the binary data has been written. Specifically, while data "1" is retained, Vf decreases from 3 V, which was applied to the ferroelectric when the data "1" was written. Accordingly, the intersection between the upper voltage-fall curve 2 of the hysteresis loop and the characteristic 56 will be the operating point 3 of the data "1" retaining operation. On the other hand, while data "0" is retained, Vf increases from −3.5 V, which was applied to the ferroelectric when the data "0" was written. Accordingly, the intersection between the lower voltage-rise curve 1 of the hysteresis loop and the characteristic 56 will be the operating point 4 of the data "0" retaining operation.

As shown in FIG. 13, the operating point Vx of the data "1" retaining operation is −0.8 V, and Vf=−0.8 V. Since Vg=0 V during this retention operation, Vi=0.8 V. On the other hand, the operating point Vx of the data "0" retaining operation is 0.7 V, and Vf=0.7 V. Since Vg=0 V during this retention operation, Vi=−0.7 V. That is to say, since Vi>Vti while the data "1" is being retained, the FET is ON. Conversely, since Vi <Vti while the data "0" is being retained, the FET is OFF.

Finally, data is read out by applying a voltage Vd of 0.5 V to the drain electrode while the control electrode is still floating. If the voltage at the floating electrode is larger than the threshold voltage of the FET (i.e., when Vi>Vti), then the FET turns ON and a drain current flows. Alternatively, if the voltage at the floating electrode is smaller than the threshold voltage of the FET (i.e., when Vi<ti), then the FET turns OFF and no drain current flows.

In this example, the voltage Vi of 0.8 V obtained by analyzing the operating point of the data "1" retaining operation is larger than the threshold voltage Vti of 0.5 V. Thus, the FeFET can read the data "1" out. On the other hand, the voltage Vi of −0.7 V obtained by analyzing the operating point of the data "0" retaining operation is smaller than the threshold voltage Vti of 0.5 V. Thus, the FeFET can also read the data "0" out.

T. Nakamura et al., "Electrical Characteristics of MFMIS FET Using STN Films", Technical Report of IEICE, ED98-255, SDM98-208, pp. 63–69, Feb. 1999 showed an example in which Vg was set to 0 V for a read operation. In the foregoing operation simulation, Vg is also supposed to be almost 0 V. Accordingly, similar results are obtained in either case.

However, a ferroelectric-based nonvolatile memory device has a so-called "imprint degradation" problem. Specifically, if data is retained there for a long time, the device will no longer be able to read the data out accurately, because the polarization will have decreased at that time so that the device will have its operating point changed. In the foregoing example, the voltage Vi, representing the operating point of the data "1" retaining operation, is 0.8 V. In this case, however, a margin available to the FeFET that should meet the turn-ON condition (i.e., Vi >Vti), or a maximum allowable variation of the floating gate electrode voltage Vi within which the data "1" can be written or read out accurately, is as small as 0.3 V. Accordingly, if Vi decreases by more than 0.3 V due to the decrease in polarization, then the FET cannot satisfy the turn-ON condition anymore. As a result, the data "1" can no longer be read out accurately. As for the data "0" retaining operation on the other hand, Vi=−0.7 V and there is a sufficient margin of 1.2 V available to the FET that should meet the turn-OFF condition (i.e., Vi<Vti).

While data "1" is retained, the FET is ON as described above. Accordingly, in an array of memory cells in which the respective drain electrodes of multiple FeFETs are connected to a bit line, a select transistor should be additionally provided for each of those drain electrodes. See Japanese Laid-Open Publication Nos. 5-205487 and 5-206411 (both published on Aug. 13, 1999). Therefore, when a semiconductor memory device, including multiple FeFETs arranged in matrix, performs reading by detecting the level of a drain current flowing through particular one of the FeFETs, the drain currents of the other FeFETs in the retention state should be blocked using select transistors. For that reason, it is difficult to increase the number of FeFETs integrated as intended.

SUMMARY OF THE INVENTION

It is therefore an object of the present invention to provide a method of setting a best voltage for a semiconductor memory device to read out data while improving the retention characteristic of the device.

An inventive data reading method is applicable to a semiconductor memory device that includes: a capacitor having two electrodes and a ferroelectric interposed between the electrodes; and a field effect transistor having source, drain and gate electrodes. In the device, one of the two electrodes of the capacitor is connected to, or used in common as, the gate electrode of the transistor, while the other electrode of the capacitor is used as a control electrode. In this reading method, a voltage is applied to the control electrode, thereby changing a polarization of the ferroelectric and eventually a channel resistance of the transistor so that the channel resistance can represent binary data depending on whether the resistance is high or low. This reading method is characterized by applying a positive voltage to the control electrode if a threshold voltage of the transistor is positive, and by applying a negative voltage to the control electrode if the threshold voltage of the transistor is negative. According to this data reading method, a particular voltage Vread is applied to the control electrode during a read operation, thereby substantially eliminating the difference between the turn-OFF margin of 1.2 V and the turn-ON margin of 0.3 V. That is to say, since the margin allowed for the turn-ON condition Vi>Vti can be increased, the retention characteristic of the device improves greatly.

In one embodiment of the present invention, if the threshold voltage of the transistor is positive, the polarization of the capacitor is changed by increasing an interelectrode voltage from 0 V on the supposition that a remanent polarization of 0 C/cm$^2$ initially exists in the capacitor. Then, the voltage applied to the control electrode is set to a value deviated by no greater than ±20% from a sum of a first interelectrode voltage value and the positive threshold voltage of the transistor. The first interelectrode voltage value is associated with a first polarization value corresponding to a first quantity of charge created in a channel of the transistor when the positive threshold voltage is applied to the gate electrode of the transistor. On the other hand, if the threshold voltage of the transistor is negative, the polarization of the capacitor is changed by decreasing the interelectrode voltage from 0 V on the supposition that the remanent polarization of 0 C/cm$^2$ initially exists in the capacitor. Then, the voltage applied to the control electrode is set to a value deviated by no greater than ±20% from a sum of a second interelectrode voltage value and the negative threshold voltage of the transistor. The second interelectrode voltage value is associated with a second polarization value corresponding to a second quantity of charge created in the channel of the transistor when the negative threshold voltage is applied to the gate electrode of the transistor.

In this embodiment, by increasing the interelectrode voltage Vf from 0 V with a polarization of 0 C/cm$^2$ supposed to initially exist in a ferroelectric capacitor of an MFMIS FeFET, the operating point, or a read voltage, is set by reference to the Pf–vf characteristic of the capacitor and the Qi–vi characteristic of the FET. That is to say, the read voltage is set on the supposition that Pf=0 C/cm$^2$, which is a worst-case scenario possibly caused by a decrease in polarization after data has been retained for a long time. Accordingly, even if the polarization decreases during the data "1" retaining operation, the FET never fails to turn ON until the Pf value actually reaches 0 C/cm$^2$, and data can be read out accurately. In this embodiment, the read voltage applied to the control electrode should fall within a range of ±20% in view of variations of the threshold voltage and polarization. This is because the threshold voltage of an FET is variable by ±15% due to a variation in the thickness of a film deposited, the mask overlay accuracy, the depth of an etched part, the ion implant dose and/or the degree of damage, and because the polarization of a ferroelectric is also variable by ±5%.

An inventive data writing method is applicable to a semiconductor memory device that includes: a capacitor having two electrodes and a ferroelectric interposed between the electrodes; and a field effect transistor having source, drain and gate electrodes. In the device, one of the two electrodes of the capacitor is connected to, or used in common as, the gate electrode of the transistor, while the other electrode of the capacitor is used as a control electrode. In this writing method, a voltage is applied to the control electrode, thereby changing a polarization of the ferroelectric and eventually changing a channel resistance of the transistor so that the channel resistance can represent binary data depending on whether the resistance is high or low. This writing method is characterized in that the voltage applied to the control electrode falls within such a range as to turn OFF the transistor after the voltage applied to the electrode has been removed therefrom. According to this data writing method, no matter whether data "0" or "0" is retained, the FET is always OFF and no drain current flows.

An inventive method for driving a semiconductor memory device includes the steps of: writing data on the device by the inventive writing method; and then applying a reset voltage to the control electrode. According to this driving method, after a write operation has been performed, the interelectrode voltage quickly reaches the operating point of the retaining operation.

In reading out data from a semiconductor memory device, on which data has been written by the inventive writing method, if a threshold voltage of the transistor is positive, then a positive voltage, which is equal to or smaller than the threshold voltage of the transistor, is applied to the control electrode. Alternatively, if the threshold voltage of the transistor is negative, then a negative voltage, which is equal to or larger than the threshold voltage of the transistor, is applied to the control electrode. According to this data reading method, even an FeFET, which is OFF while data "1" or "0" is retained therein, turns ON in reading out the data "1" and turns OFF in reading out the data "0". As a result, the data can be read out accurately.

The inventive data reading method is also applicable to a memory array in which multiple semiconductor memory devices are arranged in matrix. In this array, each of those memory devices includes: the capacitor having the two electrodes and the ferroelectric; the field effect transistor having the source, drain and gate electrodes; and a gate selecting transistor also having source, drain and gate electrodes. In the memory device, the drain and source electrodes of the field effect transistor are connected to a bit line and a source line, respectively. The control electrode of the memory device is connected to the source electrode of the gate selecting transistor. And the gate and drain electrodes of the gate selecting transistor are connected to first and second word lines, respectively. In such an embodiment, data still can be read out accurately even when no select transistor exists between the drain electrode and bit line (or between the source electrode and source line). Accordingly, a much greater number of devices can be integrated on a single chip.

As can be seen, according to the present invention, an increased voltage margin is available when the FeFET should perform a read operation. In addition, even if the polarization value of the ferroelectric capacitor changes, the read operation can be performed correctly until the 15 polarization reaches 0 C/cm$^2$, which is the worst-case scenario. Furthermore, no select transistor is needed between the drain electrode and bit line.

DETAILED DESCRIPTION OF INVENTION

Hereinafter, embodiments of the present invention will be described with reference to the accompanying drawings.

Embodiment 1

Figure 9:
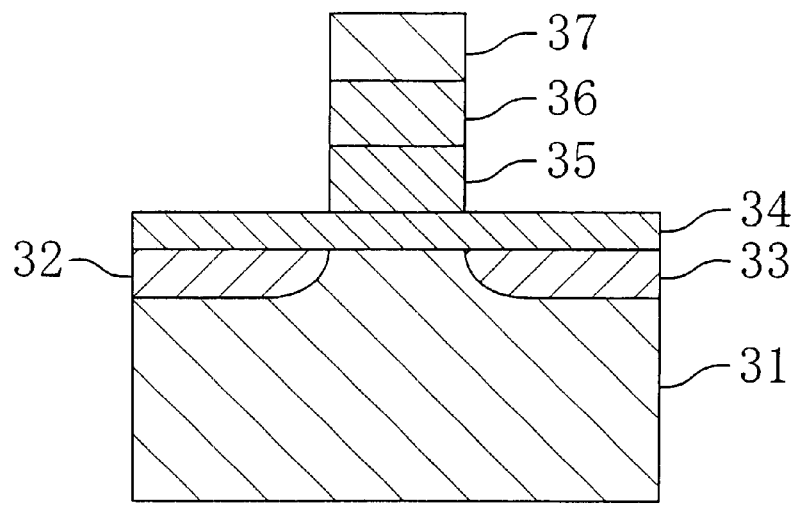
FIG. 9 is a cross-sectional view illustrating a semistructure appliable in common to the inventive and known semiconductor memory devices.
Figure 10:
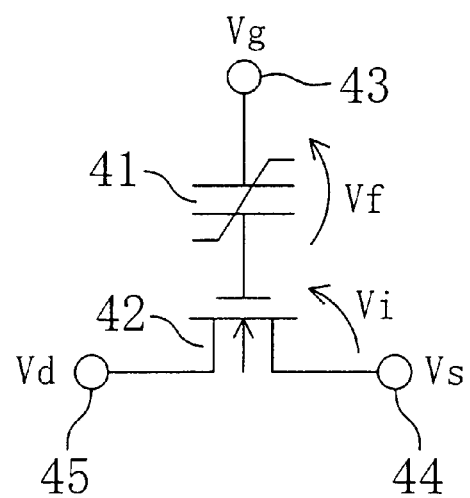
FIG. 10 is an equivalent circuit diagram of the inventive and known memory devices.
Figure 11A:
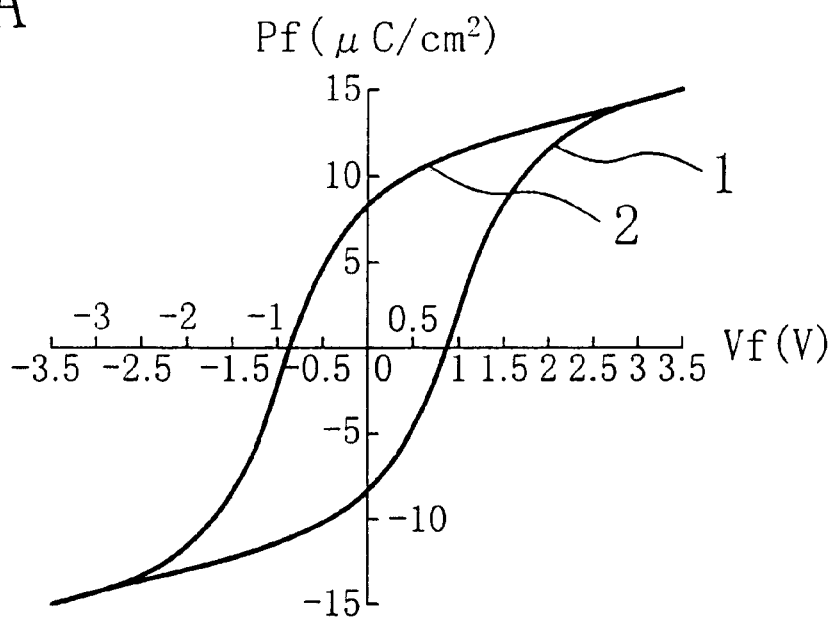
FIGS. 11A and 11B are graphs illustrating how the known memory device operates.
Figure 11B:
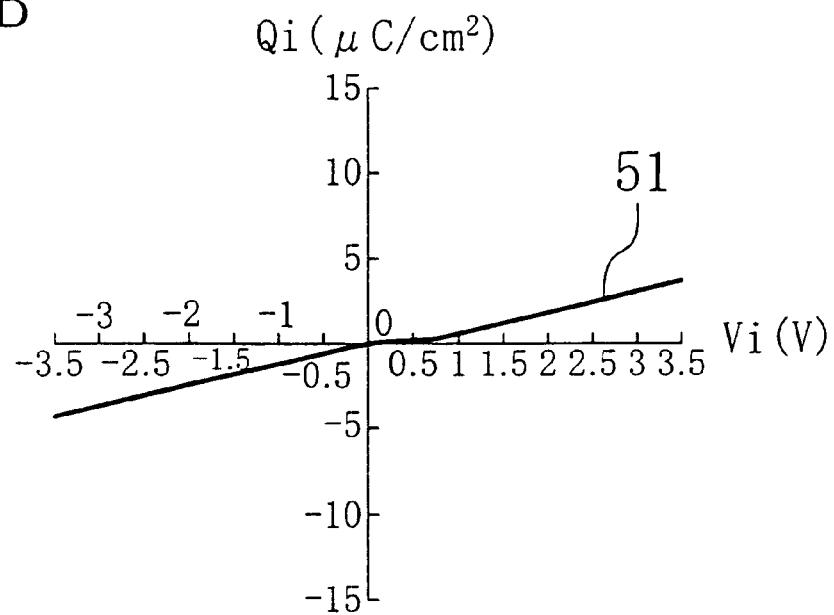
Figure 12A:
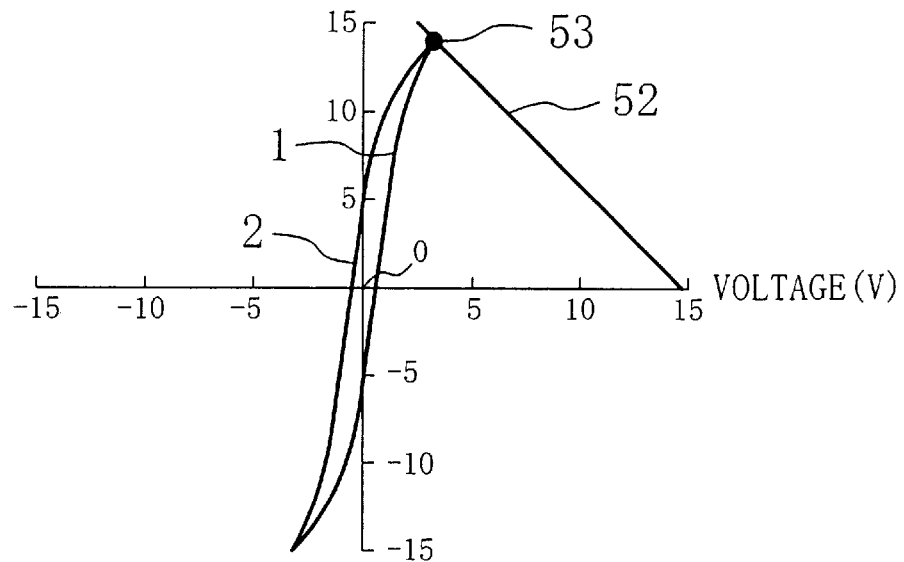
FIGS. 12A and 12B are graphs illustrating how the known memory device operates.
Figure 12B:
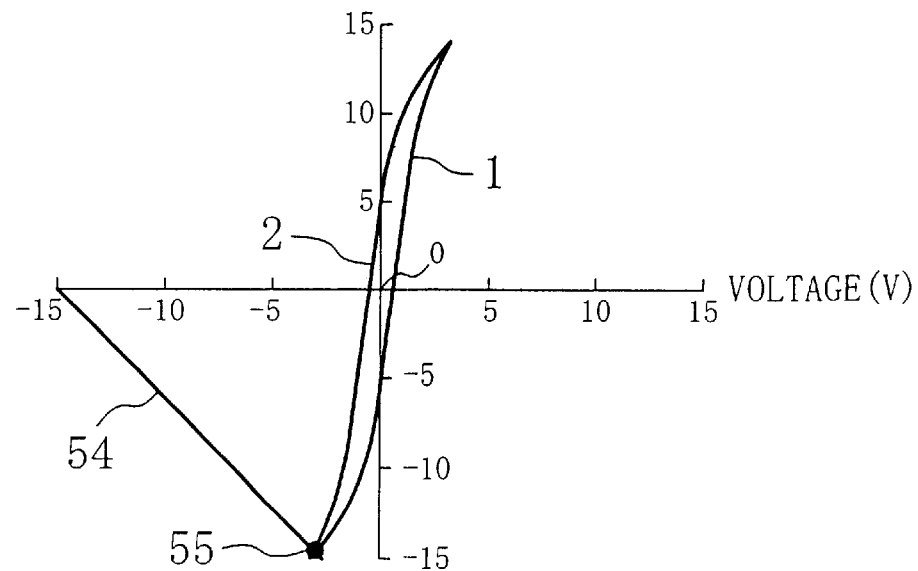
Figure 13:
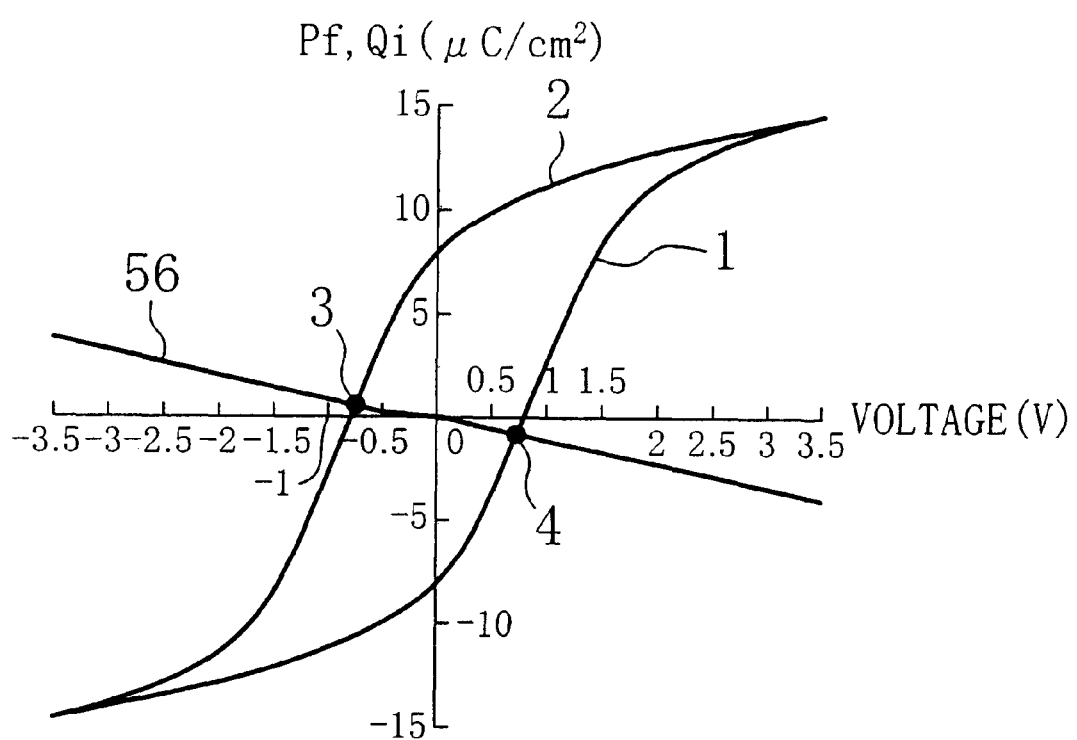
FIG. 13 is a graph illustrating how the known memory device operates.

A semiconductor memory device according to a first embodiment of the present invention has basically the same structure as that illustrated in FIG. 9 and is represented by the same equivalent circuit as that illustrated in FIG. 10 (see the background of the invention). Also, the memory device of the first embodiment performs write and retention operations in almost the same way as the known memory device.

However, the FeFET of the first embodiment is definitely different from the known FeFET in how to set a drive voltage Vread for a read operation. Specifically, according to this embodiment, the drive voltage Vread is set by applying either a positive voltage to the control electrode if the threshold voltage Vti of the FET is positive or a negative voltage to the control electrode if the threshold voltage Vti is negative.

In the illustrated embodiment, the threshold voltage Vti of the FET is supposed to be positive. Accordingly, a read operation is performed with a voltage Vg of 0.5 V applied to the control electrode. In this case, when data "1" is read out, the drain-source current Ids increases.

The FeFET of this embodiment has the same structure as the known FeFET. Specifically, for the FeFET of this embodiment, the electrode area of the ferroelectric capacitor is 2.8 $\mu$m×2.8 $\mu$m, the gate length of the FET 0.8 $\mu$m and the gate width 4 $\mu$m. The performance of the FeFET fabricated to these specifications is evaluated using Ids as an index.

Figure 1:
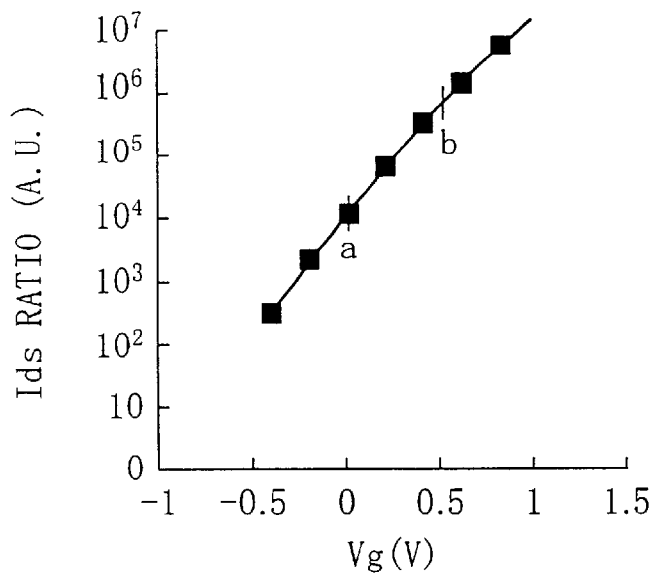
FIG. 1 is a graph illustrating how the Ids ratio (ON/OFF current ratio) between data "1" and "0" changes with Vg.

FIG. 1 illustrates how the Ids ratio (or the ON/OFF current ratio) between data "1" and "0" changed with Vg. In the known driving method (in which Vg=0 V), the Ids ratio is $10^4$ as indicated by the intersection a in FIG. 1. In contrast, according to the first embodiment (in which Vg=0.5 V), the Ids ratio is $5×10^5$ as indicated by the intersection b in FIG. 1. That is to say, by applying the voltage of 0.5 V to the control electrode, the initial Ids ratio increases fiftyfold.

This sample device was left for a long time at room temperature and then the Ids change was measured. As a result, after the device had been left for $10^6$ seconds, Ids for data "1" decreased to about one-tenth. However, since the initial Ids ratio of the inventive device is fifty times as large as the known one, the lifetime of the inventive device, i.e., a time it takes for the device to cause a failure, is still much longer than that obtained by the known driving method.

Next, the read operation according to this embodiment will be simulated as in the description of the related art to verify the appropriateness of the inventive reading method.

The inventive memory device writes and retains data in the same way as the prior art. That is to say, the inventive memory device also operates as illustrated in FIGS. 11A, 11B, 12A, 12B and 13. Specifically, while data "1" is retained, the operating point of the device is as indicated by the intersection 3 shown in FIG. 13. On the other hand, while data "0" is retained, the operating point of the device is as indicated by the intersection 4 shown in FIG. 13.

Figure 2:
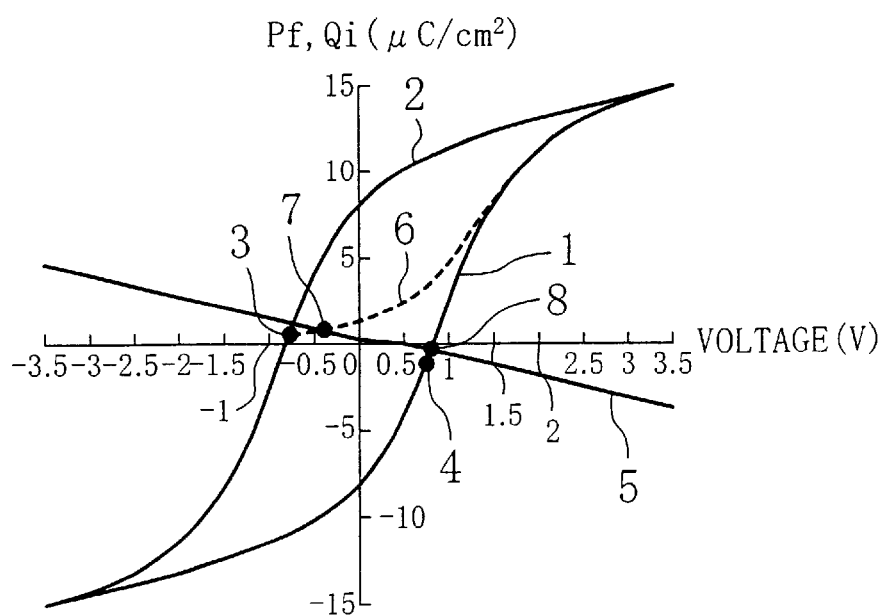
FIG. 2 is a graph illustrating how a semiconductor memory device according to a first embodiment of the present invention operates.

In the following illustrative embodiment, it will be lo described with reference to FIG. 2 how the memory device performs a read operation after the data "1" or "0" has been retained there. In FIG. 2, Pf–Vf characteristics exhibited by the ferroelectric capacitor when the voltage applied thereto is increased or decreased are represented by the curves 1 and 2, respectively. Operating points for retaining the data "1" or "0" are identified by the reference numerals 3 and 4, respectively. A Qi–(Vg–Vf) characteristic exhibited by the FET when the voltage Vg of 0.5 V is applied to the control electrode is represented by the curve 5. A Pd–Vf characteristic exhibited by the ferroelectric capacitor when the voltage applied thereto is increased from the operating point 3 is represented by the dashed curve 6. And operating points for reading out the data "1" or "0" are identified by the reference numerals 7 and 8, respectively.

In the method of setting the drive voltage Vread for a read operation according to the first embodiment, if the threshold voltage Vti of the FET is positive, the read operation is performed with a positive voltage applied to the control electrode.

For example, where data "0" should be read out with the voltage Vg of 0.5 V applied to the control electrode as shown in FIG. 2, the voltage, which is almost equal to 0 V while the data "0" is retained, increases. The operating point 4 for retaining the data "0" is located on the Pf–Vf characteristic 1 exhibited by the ferroelectric capacitor when the voltage applied thereto is increased. Accordingly, the intersection between the Pf–Vf characteristic 1 and the Qi–(Vg–Vf) characteristic 5 of the FET is the operating point 8 for reading out the data "0". In the example illustrated in FIG. 2, Vx=0.8 V at the operating point 8. That is to say, Vf=–Vx=–0.8 V and Vi=Vg–Vx=–0.3 V.

Next, where data "1" should be read out, the operating point 3 for retaining the data "1" is located on the Pf–Vf characteristic 2 exhibited by the ferroelectric capacitor when the voltage applied thereto is decreased. Accordingly, a Pf–Vf characteristic exhibited by the ferroelectric capacitor when the voltage applied thereto is increased from the operating point 3 should be newly obtained.

Miller et al. disclosed how a ferroelectric behaves if the voltage applied thereto is changed while the polarization of the ferroelectric is no greater than the saturated polarization Ps represented by a hysteresis loop. See S. L. Miller et al., "Modeling ferroelectric capacitor switching with asymmetric nonperiodic input signals and arbitrary initial conditions", Journal of Applied Physics, 70 (5), pp. 2849–2860, September 1991. The approach adopted by Miller et al. (which will be herein simply called "Miller's approach") is given by the following Equation (4):

$$\partial Pd/\partial E = \Gamma \cdot \partial Psat/\partial E$$

where Psat is the value of polarization on the saturated hysteresis loop, Pd is the value of polarization lying within the saturated loop and E is an electric field applied to the ferroelectric. As can be seen from this Equation (4), the derivative $\partial Pd/\partial E$ of a polarization Pd lying within the loop at a given field E is obtained by multiplying the derivative $\partial Psat/\partial E$ of the saturated polarization Psat with respect to the given field E by a function $\Gamma$. It should be noted that the saturated polarization Psat is equivalent to Pf used in the foregoing discussion to represent a value of polarization and that any polarization lying within the saturated hysteresis loop will be herein identified by Pd after Miller's notation.

The function r is given by the following Equation (5):

$$\Gamma = 1 - \tan h[\{(Pd - Psat)/(\xi \cdot Ps - Pd)\}^{1/2}] \qquad (5)$$

where $\xi$ is +1 for increasing voltages and $\xi$ is –1 for decreasing voltages.

The Pd–Vf characteristic, exhibited by the ferroelectric capacitor when the voltage applied thereto is increased from e operating point 3, can be represented by the curve 6 in FIG. 2 according to the Miller's approach. Thus, the intersection between this Pd–Vf characteristic 6 and the Qi–(Vg–Vf) characteristic 5 of the FET will be the operating point 7 for reading the data "1". In the example illustrated n FIG. 2, Vx=−0.4 V at the operating point 7. That is to say, Vf=−Vx=0.4 V and Vi=Vg−Vx=0.9 V.

The condition Vi>Vti must be met for the FET to turn ON. Accordingly, a margin available to the data "1" reading operation is: Vi−Vti=0.9 V−0.5 V=0.4. V. That is to say, compared to the data "1" read margin of 0.3 V available from the known reading method, the margin increases by 0.1 V. On the other hand, a data "0" read margin meeting the FET turn-OFF condition is: Vti−Vi=0.5 V−(−0.3 V)=0.8 V.

In the known method, the margin (0.3 V) available to the FET that should meet the turn-ON condition is much smaller than the margin (1.2 V) available to the FET that should meet the turn-OFF condition (those margins will be herein simply called "turn-ON margin" and "turn-OFF margin", respectively). In contrast, the present invention can increase the turn-ON margin by performing read operations with a voltage Vg of 0.5 V applied to the control electrode, thus providing an FeFET with superior retention characteristics.

In the foregoing first illustrative embodiment, an n-channel FET with a threshold voltage Vti of 0.5 V is used and read operations are performed with a voltage Vg of 0.5 V applied to the control electrode. However, as for a depletion mode n-channel FET with a threshold voltage Vti smaller than 0 V, it is clear from the foregoing discussion that the turn-OFF margin will be smaller than the turn-ON margin. In that case, the turn-OFF margin can also be increased by applying a negative voltage (i.e., Vg<0 V) to the control electrode. The same statement is equally applicable to a p-channel FET.

Embodiment 2

Like the memory device of the first embodiment, a semiconductor memory device according to a second embodiment of the present invention also has the same structure as that of the known memory device illustrated in FIG. 9 and is represented by the same equivalent circuit illustrated in FIG. 10. Also, the memory device of the second embodiment performs write and retention operations in almost the same way as the known memory device and the memory device of the first embodiment.

In the method of setting a drive voltage Vread for a read operation according to the first embodiment, if the FET has a positive threshold voltage Vti, the read operation is performed with a positive voltage applied to the control electrode. However, according to the second illustrative embodiment, the value of the voltage Vread applied to the control electrode during reading is optimized by a unique method. Specifically, if the threshold voltage Vti of the FET is positive, the polarization of the capacitor is changed by increasing an interelectrode voltage from 0 V on the supposition that a remanent polarization of 0 C/cm$^2$ initially exists in the capacitor. Then, the voltage Vread applied to the control electrode is set to a value deviated by no greater than ±20% from a sum of a first interelectrode voltage value and the positive threshold voltage Vti of the FET. The first interelectrode voltage value is associated with a first polarization value corresponding to a first quantity of charge created in the channel of the FET when the positive threshold voltage Vti is applied to the gate electrode of the FET. On the other hand, if the threshold voltage Vti of the FET is negative, the polarization of the capacitor is changed by decreasing the interelectrode voltage from 0 V on the supposition that the remanent polarization of 0 C/cm$^2$ initially exists in the capacitor. Then, the voltage Vread applied to the control electrode is set to a value deviated by no greater than ±20% from a sum of a second interelectrode voltage value and the negative threshold voltage vti of the FET. The second interelectrode voltage value is associated with a second polarization value corresponding to a second quantity of charge created in the channel of the FET when the negative threshold voltage Vti is applied to the gate electrode of the FET.

Now it will be described with reference to FIGS. 3A through 3C how to set the drive voltage Vread for a read operation according to the second embodiment.

Figure 3A:
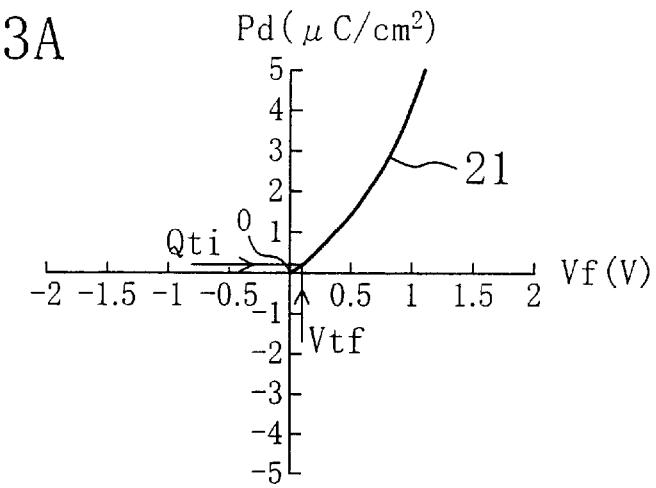
FIGS. 3A through 3C are graphs illustrating how a semiconductor memory device according to a second embodiment of the present invention operates.

FIG. 3A illustrates a Pd–Vf characteristic 21 exhibited by the ferroelectric capacitor when the voltage applied thereto is increased from 0 V on the supposition that a remanent polarization of 0 C/cm$^2$ initially exists in the capacitor. A worst-case scenario, which might possibly occur if the polarization remaining in the ferroelectric capacitor of the FeFET decreased during the retention operation, is that the remanent polarization decreases to reach 0 C/cm$^2$. That is to say, the Pd–Vf characteristic 21 of the ferroelectric capacitor as shown in FIG. 3A represents a worst case like that.

Figure 3B:
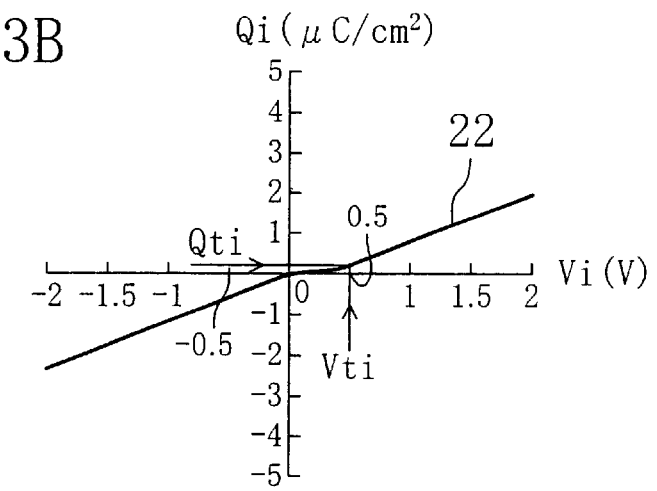

FIG. 3B illustrates a Qi–Vi characteristic 22 of the FET. As represented by this characteristic 22 in FIG. 3B, a charge quantity Qti associated with the threshold voltage Vti of 0.5 V is 0.2 $\mu$C/cm$^2$. Accordingly, an interelectrode voltage Vtf, associated with a polarization value Pd of the ferroelectric capacitor that corresponds to this charge quantity Qti, is obtained from the characteristic 21 shown in FIG. 3A. In the illustrated embodiment, Vtf=0.05 V.

According to the second embodiment, a read operation is performed with a voltage Vread(=Vtf+Vti=0.05 V+0.5 V=0.55 V) applied to the control electrode. In view of possible variations of the threshold voltage and polarization value, Vtf is variable by ±5%, Vti is variable by ±15% and Vread is variable by about ±20%. Specifically, in the illustrated embodiment, 0.0475 V<Vtf<0.0525 V and 0.425 V<Vti<0.575 V.

Figure 3C:
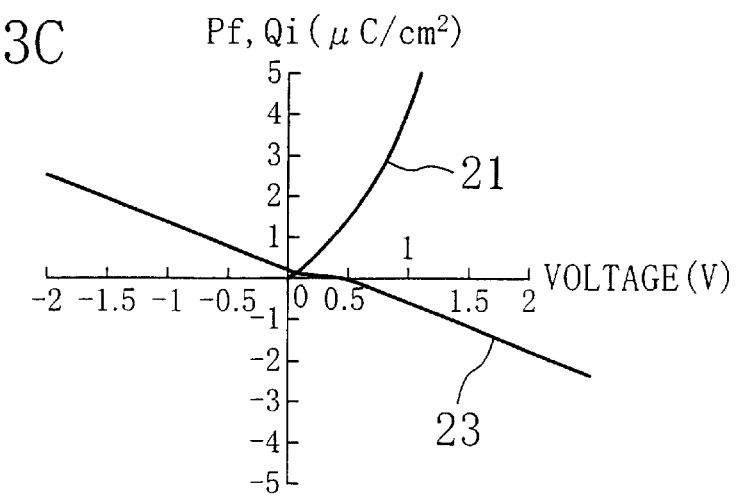

FIG. 3C illustrates a Qi–(Vg–Vf) characteristic 23 to be exhibited by the FET when this read voltage Vread is applied as the voltage Vg to the control electrode. That is to say, FIG. 3C illustrates how the FeFET will operate where the read operation is started at the worst-case remanent polarization of 0 c/cm$^2$. In this method, the voltage Vi, applied to the floating gate electrode of the FET at the intersection between the Pd–Vf characteristic 21 and the Qi–(Vg–Vf) characteristic 23 of the FET where the voltage starts to be increased when the polarization of 0 C/cm$^2$ initially exists in the capacitor, is equal to the threshold voltage Vti (i.e., Vi=Vti). In the following description, the operating point in this worst-case scenario will be identified by Vx=Vx0(=Vtf).

Supposing the polarization is larger than the worst-case polarization (i.e., Pd>0 C/cm$^2$), the Pd–Vf characteristic during the read operation will be located above the characteristic 21 shown in FIG. 3C. Accordingly, the intersection between that Pd–Vf characteristic and the Qi–(Vg–Vf) characteristic 23 of the FET will be located on the left-hand side of the intersection shown in FIG. 3C. If the voltage at the former intersection is identified by Vx1, then Vx1<Vx0. That is to say, Vi=Vread−Vx1=Vtf+Vti−Vx1=Vx0+Vti−Vx1>Vti. Consequently, Vi>Vti, which is the FET turn-ON condition, is met.

Alternatively, if the polarization is smaller than the worst-case polarization (i.e., Pd<0 C/cm$^2$), then the Pd–Vf characteristic during the read operation will be located below the characteristic 21 shown in FIG. 3C. Accordingly, the intersection between that Pd–Vf characteristic and the Qi–(Vg−

Vf) characteristic 23 of the FET will be located on the right-hand side of the intersection shown in FIG. 3C. If the voltage at the former intersection is identified by Vx2, then Vx2>Vx0. That is to say, Vi=Vread−Vx2=Vtf+Vti−Vx2=Vx0+Vti−Vx2<Vti. Consequently, Vi<Vti, which is the FET turn-OFF condition, is met.

As can be seen, by setting the voltage Vread applied to the control electrode during a read operation in accordance with the method of the second embodiment, even if the polarization has changed, the FET turn-ON condition Vi>Vti is always met so long as the polarization is larger than the worst-case one (i.e., Pd>0 C/cm$^2$). As a result, data "1" can be read out correctly. In the same way, according to the second embodiment, even if the polarization has changed, the FET turn-OFF condition Vi<Vti is always met so long as the polarization is smaller than the worst-case one (i.e., Pd<0 C/cm$^2$). As a result, data "0" can also be read out correctly.

Figure 4A:
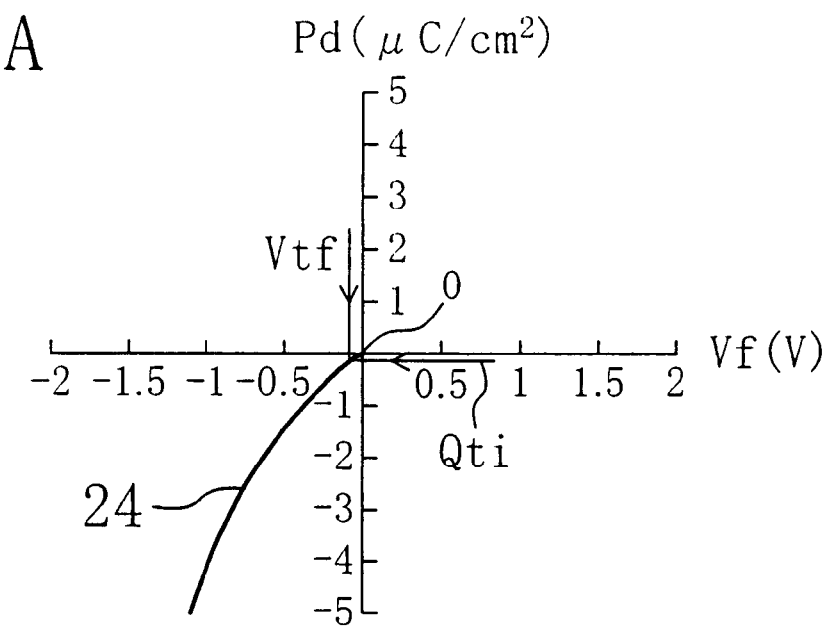
FIGS. 4A and 4B are graphs illustrating how the memory device of the second embodiment operates.
Figure 4B:
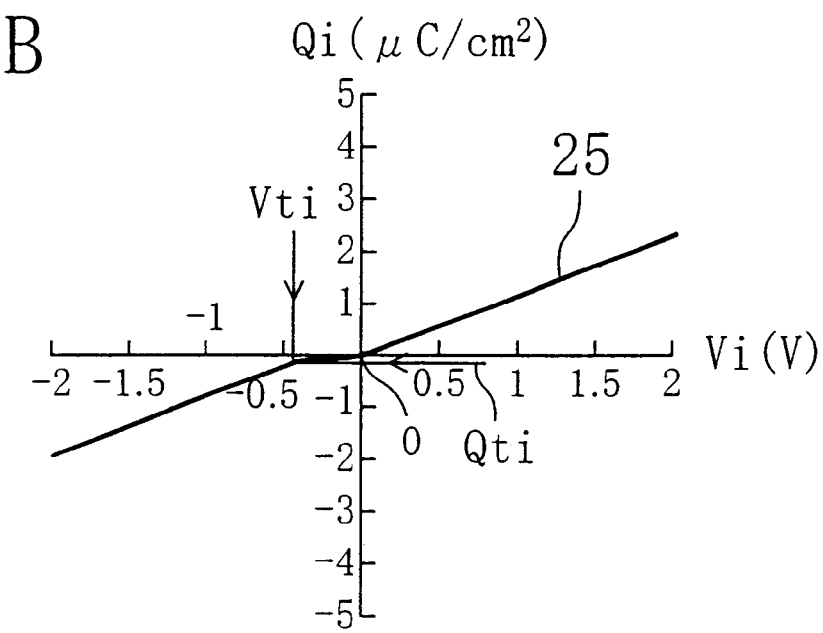

The second illustrative embodiment of the present invention has been described as being applied to an n-channel FET with a threshold voltage Vti of 0.5 V. As for a p-channel FET with a threshold voltage Vti smaller than 0 V, for example, an optimum read voltage Vread can be obtained in a similar manner using a Pd–Vf characteristic 24 shown in FIG. 4A and a Qi–Vi characteristic 25 of the FET shown in FIG. 4B. The characteristic 24 is exhibited by the capacitor if the voltage applied thereto starts to be decreased from 0 V when a remanent polarization of 0 C/cm$^2$ initially exists in the capacitor. The same statement is equally applicable to a depletion mode n-channel FET.

EMBODIMENT 3

In the known method, a large voltage Vd of about ±15 V is applied to the control electrode during a write operation so that polarization still exists in the ferroelectric and a source-drain current still flows even after the voltage has been removed therefrom.

According to a third illustrative embodiment of the present invention, a voltage Vg applied to the control electrode during a write operation should fall within such a range as to turn the FET OFF after the voltage Vg has been removed therefrom. In this method, by applying such small a write voltage Vi as to turn the FET OFF to the gate electrode of the FET, the FET is kept OFF and no drain current flows while data "1" or "0" is being retained. And during a read operation, a small read voltage is applied to the gate electrode of the FET so that data can be read out accurately.

A semiconductor memory device according to the third embodiment has basically the same structure as that illustrated in FIG. 9 and is represented by the same equivalent circuit as that illustrated in FIG. 10. Also, the memory device of the third embodiment performs write and retention operations in almost the same way as the known memory device. Furthermore, as described for the first embodiment, the FET has a positive threshold voltage Vti and a read operation is performed with a voltage of 0.5 V (=Vti) applied to the control electrode.

In the known FeFET and the FeFETs of the first and second embodiments, a voltage Vg of ±15 V is applied to the control electrode during a write operation. According to this third embodiment, however, a write voltage Vg of ±3 V is applied thereto.

Figure 5A:
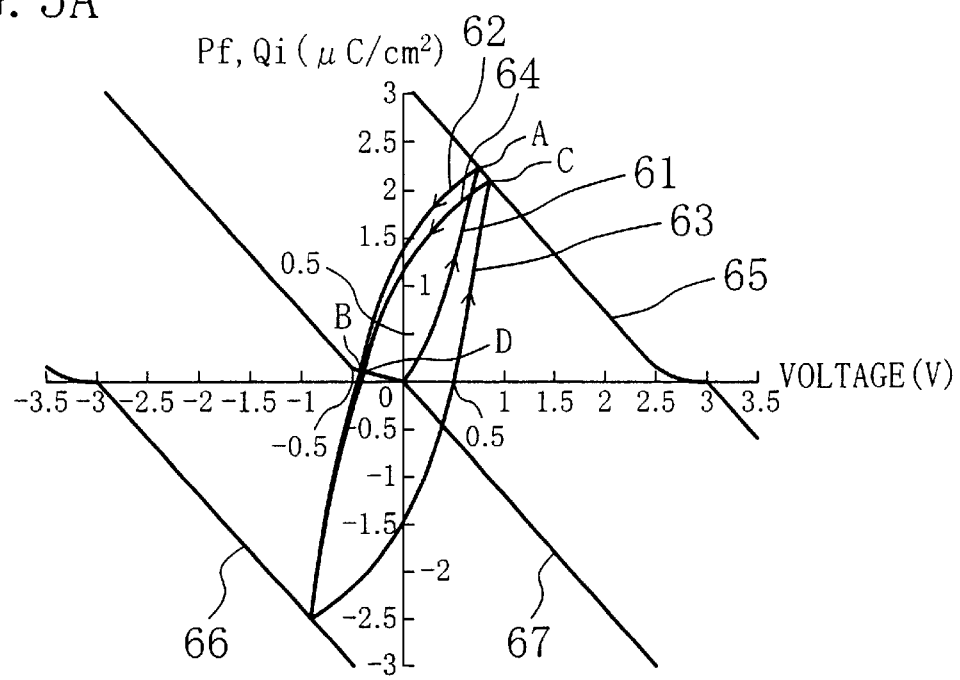
FIGS. 5A and 5B are graphs illustrating how a semiconductor memory device according to a third embodiment of the present invention operates.
Figure 5B:
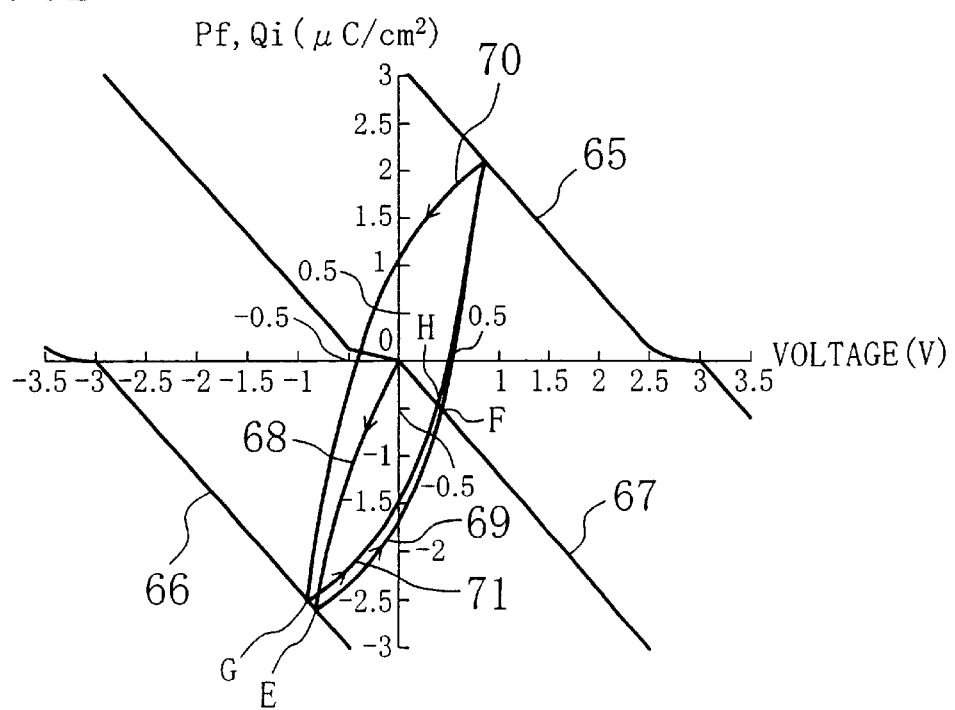

FIG. 5A illustrates how the FeFET of the third embodiment performs a data "1" writing operation with a voltage Vg of 3 V applied to the control electrode. FIG. 5B illustrates how the FeFET performs a data "o" writing operation with a voltage Vg of −3 V applied to the control electrode. And FIG. 6 illustrates how the FeFET performs a data reading operation with a voltage Vg of 0.5 V applied to the control electrode.

Figure 6:
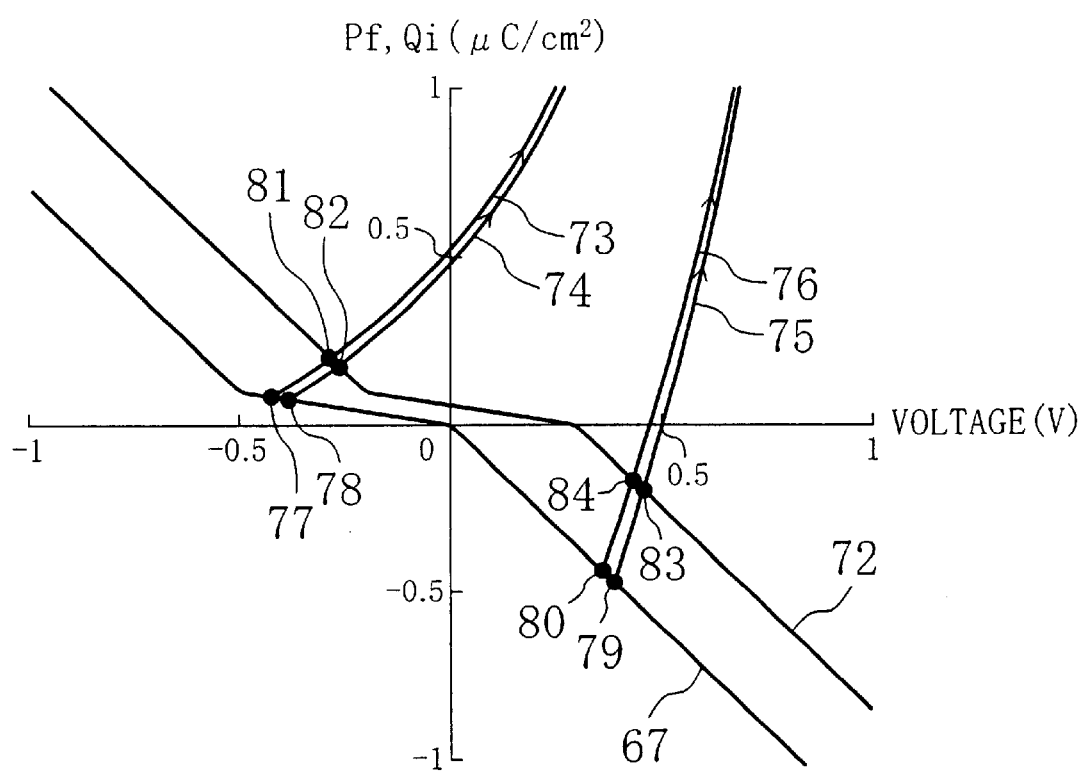
FIG. 6 is a graph illustrating how the memory device of the third embodiment operates.

In FIGS. 5A, 5B and 6, Pd–Vf characteristics 61, 63, 69, 71, 73, 74, 75 and 76 are exhibited by the ferroelectric capacitor when the voltage applied to the control electrode is increased. On the other hand, Pd–Vf characteristics 62, 64, 68 and 70 are exhibited by the ferroelectric capacitor when the voltage applied to the control electrode is decreased. Each of these characteristics has a different initial polarization value. In FIGS. 5A and 5B, curves 65, 66 and 67 represent Qi–(Vg−Vf) characteristics exhibited by the FET during the data "1" writing, data "0" writing and retention operations, respectively. In FIG. 6, a curve 72 represents a Qi–(Vg−Vf) characteristic exhibited by the FET during a read operation, and operating points are identified by the reference numerals 77 through 84.

It will be now described with reference to FIG. 5A how to write data "1" in each of two initial states. In the illustrated embodiment, the two initial states include a state in which no data has been written at all on the ferroelectric (i.e., there is a remanent polarization of 0 C/cm$^2$) and an opposite data state. These two initial states will be considered, because compared with the operation of writing the same data as the retained one, the operation condition is tougher, or a data writing operation in any of these states will result in a smaller polarization at the same voltage applied.

First, if a positive voltage is applied to the ferroelectric with an initial polarization of 0 C/cm$^2$, then the resultant Pd–Vf characteristic will be represented by the curve 61. Where a voltage Vg of 3 V is applied to the control electrode, the FET will exhibit the Qi–(Vg−Vf) characteristic 65. And the intersection A between the Pd–Vf characteristic 61 and the Qi–(Vg−Vf) characteristic 65 is the operating point for writing the data "1". In this case, if the control electrode is allowed to be floating, then the Qi–(Vg−Vf) characteristic 67 of the FET reaches the vicinity of Vg≈0 V. As a result, the FeFET starts to perform a retention operation. The operating point for retaining the data "1" is represented by the intersection B between the Pd–Vf characteristic 62 exhibited by the capacitor where the voltage starts to be decreased at the write operation point and the Qi–(Vg−Vf) characteristic 67 in the vicinity of Vg≈0 V. In the illustrated embodiment, the operating voltage Vx at the retention operation point B is −0.42 V. Optionally, after the voltage Vg of 3 V has been applied to the control electrode, a voltage Vg of 0 V may be applied as a reset voltage thereto so that the Qi–(Vg−Vf) characteristic is represented by the curve 67 quickly.

If data "0" has been written as an initial value on the ferroelectric, then the intersection C between the Pd–Vf S characteristic 63 and the Qi–(Vg−Vf) characteristic 65 at the voltage Vg of 3 V is the operating point for writing the data "1". And the intersection D between the Pf–Vd characteristic 64 exhibited by the ferroelectric capacitor when the voltage starts to be decreased at the write operation point C and the Qi–(Vg−Vf) characteristic 67 is the retention operation point. In the illustrated embodiment, the operating voltage Vx at the retention operation point D is −0.39 V.

As can be seen, where the data "1", which was written in any of these two initial states, is retained, the floating gate electrode voltage Vi of the FET is: Vg−Vx=0.42 V or 0.39 V, thus meeting the FET turn-OFF condition Vi<Vti. That is to say, the FET is in OFF state and no drain current flows.

Next, it will be described with reference to FIG. 5B how to write data "0" in each of the two initial states.

If a negative voltage is applied to the ferroelectric with an initial polarization of 0 C/cm$^2$, then the resultant Pd–Vf characteristic will be represented by the curve 68. Where a voltage Vg of −3 V is applied to the control electrode, the FET will exhibit the Qi−(Vg−Vf) characteristic 66. And the intersection E between the Pd−Vf characteristic 68 and the Qi−(Vg−Vf) characteristic 66 is the operating point for writing the data "0". In this case, either by allowing the control electrode to be floating or by applying a voltage Vg of 0 V thereto, the FeFET is made to start performing a retention operation. The operating point for retaining the data "0" is represented by the intersection F between the Pd−Vf characteristic 69 exhibited by the capacitor where the voltage starts to be increased at the write operation point and the Qi−(Vg−Vf) characteristic 67 in the vicinity of Vg≈0 V. In this embodiment, the operating voltage Vx at the retention operation point F is 0.4 V.

If data "1" has been written as an initial value on the ferroelectric, then the intersection G between the Pd−Vf characteristic 70 and the Qi−(Vg−Vf) characteristic 66 at the voltage vg of −3 V is the operating point for writing the data "0". And the intersection H between the Pf−Vd characteristic 71 exhibited by the capacitor when the control electrode voltage starts to be increased at the write operation point G and the Qi−(Vg−Vf) characteristic 67 is the retention operation point. In the illustrated embodiment, the operating voltage Vx at the retention operation point H is 0.38 V.

As can be seen, where the data "0", which was written in any of the two initial states, is retained, the floating gate electrode voltage Vi of the FET is: Vg−Vx=−0.40 V or −0.38 V, thus meeting the FET turn-OFF condition Vi<Vti. That is to say, the FET is in OFF state and no drain current flows.

Next, it will be described with reference to FIG. 6 how to read data "1" that was written in any of the two initial states. In performing this operation, a voltage Vg of 0.3 V is applied to the control electrode.

The operating points for retaining the data "1", written on the ferroelectric which had an initial polarization of 0 C/cm² or on which data "0" had been written, are identified by the reference numerals 77 and 78, respectively. And the intersection 81, 82 between the Pd−Vf characteristic 73, 74 exhibited by the capacitor when the voltage starts to be increased at the retention operation point 77, 78 and the Qi(Vg−Vf) characteristic 72 of the FET at the voltage Vg of 0.3 V applied is the read operation point. In the illustrated embodiment, the read operation voltage Vx is −0.30 V or −0.28 V. Accordingly, Vi=Vg−Vx=0.60 V or 0.58 V, each of which is larger than the threshold voltage (i.e., Vi>Vti). As a result, the FeFET turns ON and the data "1" can be read out correctly.

Next, it will be described with reference to FIG. 6 how to read data "0" that was written in any of the two initial states.

The operating points for retaining the data "0", written on the ferroelectric which had an initial polarization of 0 C/cm² or on which data "1" had been written, are identified by the reference numerals 79 and 80, respectively. And the intersection 83, 84 between the Pd−Vf characteristic 75, 76 exhibited by the capacitor when the voltage starts to be increased at the retention operation point 79, 80 and the Qi−(Vg−Vf) characteristic 72 of the FET at the voltage Vg of 0.3 V applied is the read operation point. In the illustrated embodiment, the read operation voltage Vx is 0.46 V or 0.44 V. Accordingly, Vi=Vg−Vx=−0.16 V or −0.14 V, each of which is smaller than the threshold voltage (i.e., Vi<Vti). As a result, the FeFET turns OFF and the data "0" can be read out correctly.

As can be seen, according to the third embodiment, whether the data "1" or "0" written should be retained, the FeFET is OFF. Also, by applying a voltage Vg of 0.3 V, the read operation can be performed correctly. As a result, an array of memory cells can be formed even if no select transistor is inserted between the drain electrode and bit line unlike the prior art. A specific example will now be described with reference to FIG. 7.

Figures 7, 8:
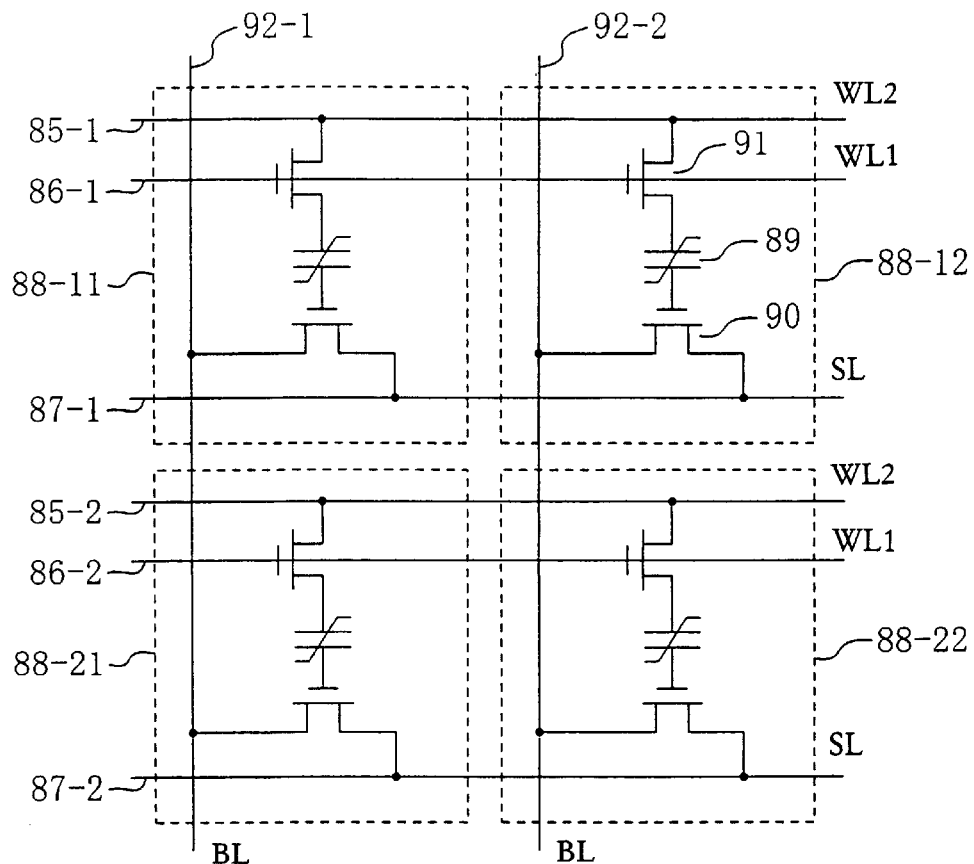
FIG. 7 is a diagram illustrating an array in which the memory device of the third embodiment are arranged in matrix.
FIG. 8 is a table illustrating drive voltages for the memory device of the third embodiment.

As shown in FIG. 7, each pair of ferroelectric capacitor 89 and FET 90 forms an FeFET, which is connected to an associated gate selecting transistor 91. Specifically, the capacitor 89 has two electrodes and a ferroelectric interposed between the electrodes; and a field effect transistor 90 having source, drain and gate electrodes, and in which one of the two electrodes of the capacitor 89 is connected to, or used in common as, the gate electrode of the transistor 90, while the other electrode of the capacitor 89 is used as a control electrode. Additionally, the drain and source electrodes of the FET 90 are connected to a bit line BL and a source line SL, respectively, and where the control electrode of the memory device is connected to the source electrode of the gate selecting transistor 91, and where the gate and drain electrodes of the gate selecting transistor 91 are connected to first and second word lines WL1 and WL2, respectively. FET 90 and gate selecting transistor 91, is identified by the reference numeral 88.

A two-by-two array of memory cells is illustrated in FIG. 7. In this array, the number attached to each of these components indicates a column number and/or a row number. For example, the reference numerals 86-1, 85-1 and 87-1 denote WL1, WL2 and SL on the 1$^{st}$ row, 92-1 denotes BL on the 1$^{st}$ column, and 88-11 denotes a memory cell on the 1$^{st}$ row, 1$^{st}$ column.

By applying the inventive driving method to a memory cell located at an arbitrary address in a memory array like this, the array can function as a nonvolatile memory. FIG. 8 is a table summarizing this driving method.

For example, in reading out data that was written on a memory cell 88-11 on the 1$^{st}$ row, 1$^{st}$ column of the memory array shown in FIG. 7, 5 V is applied through the WL1 86-1 to turn the gate selecting transistor 91 ON and 0.3 V is applied through the WL2 85-1. In that case, a voltage Vg of 0.3 V is applied to the control electrode of the FeFET in the cell 88-11. And by applying 0.3 V and 0 V through the BL 92-1 and SL 87-1, respectively, a drain current flows from the BL 92-1 to the SL 87-1. If a sense amplifier is connected to the end of BL 92-1 to detect a voltage drop caused by the drain current, then the data stored can be read correctly, because the drain current changes depending on the logic level of the data stored. In this case, the memory cell 88-21 on the 2$^{nd}$ row, 1$^{st}$ column of the array is also connected to the same BL 92-1 and is now performing a retention operation. However, since no drain current flows through this memory cell 88-21 as described above, the cell 88-21 does not affect the read operation on the memory cell 88-11. Accordingly, a memory cell, including no select transistor between the drain electrode and BL, is implementable.

According to the third illustrative embodiment of the present invention, an FeFET, performing a retention operation, is turned OFF by regulating the write voltage. Alternatively, an FeFET in the retention state may also be turned OFF by controlling the threshold voltage of the FET through the introduction of a dopant into the channel thereof. Furthermore, an FeFET in the retention state may also be turned OFF by adjusting the thickness, dielectric constant or coercive voltage of the ferroelectric in the FeFET or the thickness or dielectric constant of the gate insulating film in the FET or by changing the gate electrode material thereof. Even when any of these threshold voltage control techniques is adopted, the same effects are also attainable so long as a write voltage setting falls within such a range as to turn the FET OFF after the voltage applied to the control electrode has been removed therefrom.

In the foregoing embodiments, the present invention has been described as being applied to an MFMIS FeFET. However, the same inventive concept is applicable to setting an operating voltage (i.e., write or read voltage) for an MFIS FeFET, too. Accordingly, the scope of the present invention as is definitely defined in the following claims also embraces a method of setting an operating voltage for such a structure. That is to say, in the present invention, the floating gate electrode voltage may be regarded as a potential at the interface between a ferroelectric and an insulating film. Therefore, by setting the voltage in accordance with a relationship among this interface potential, charge created in the channel (i.e., Qi in the foregoing description) and a voltage at which the channel turns ON (i.e., Vti in the foregoing description), the effects of the present invention are attained.

What is claimed is:

1. A method of reading out data from a semiconductor memory device, wherein the device comprises: a capacitor having two electrodes and a ferroelectric interposed between the electrodes; and a field effect transistor having source, drain and gate electrodes, and in which one of the two electrodes of the capacitor is connected to, or used in common as, the gate electrode of the transistor, while the other electrode of the capacitor is used as a control electrode, and in which a voltage is applied to the control electrode, thereby changing a polarization of the ferroelectric and eventually a channel resistance of the transistor so that the channel resistance can represent binary data depending on whether the resistance is high or low, wherein the method comprises:

applying a positive voltage to the control electrode if a threshold voltage of the transistor is positive, and applying a negative voltage to the control electrode if the threshold voltage of the transistor is negative.

2. The method of claim 1, wherein if the threshold voltage of the transistor is positive, the polarization of the capacitor is changed by increasing an interelectrode voltage from 0 V with a remanent polarization of 0 C/cm$^2$ supposed to initially exist in the capacitor and then the voltage applied to the control electrode is set to a value deviated by no greater than ±20% from a sum of a first interelectrode voltage value and the positive threshold voltage of the transistor, the first interelectrode voltage value being associated with a first polarization value corresponding to a first quantity of charge created in a channel of the transistor when the positive threshold voltage is applied to the gate electrode of the transistor, and wherein if the threshold voltage of the transistor is negative, the polarization of the capacitor is changed by decreasing the interelectrode voltage from 0 V with the remanent polarization of 0 C/cm$^2$ supposed to initially exist in the capacitor and then the voltage applied to the control electrode is set to a value deviated by no greater than ±20% from a sum of a second interelectrode voltage value and the negative threshold voltage of the transistor, the second interelectrode voltage value being associated with a second polarization value corresponding to a second quantity of charge created in the channel of the transistor when the negative threshold voltage is applied to the gate electrode of the transistor.

3. A method of writing data on a semiconductor memory device, wherein the device comprises: a capacitor having two electrodes and a ferroelectric interposed between the electrodes; and a field effect transistor having source, drain and gate electrodes, and in which one of the two electrodes of the capacitor is connected to, or used in common as, the gate electrode of the transistor, while the other electrode of the capacitor is used as a control electrode, and in which a voltage is applied to the control electrode, thereby changing a polarization of the ferroelectric and eventually changing a channel resistance of the transistor so that the channel resistance can represent binary data depending on whether the resistance is high or low, wherein the method comprises: applying the voltage to the control electrode wherein the voltage applied to the control electrode falls within such a range as to turn OFF the transistor no matter whether data "1" or "0" is retained in the device after the voltage applied to the control electrode has been removed therefrom.

4. The method of claim 3, further comprising the steps of: writing data on the device; and then applying a reset voltage to the control electrode.

5. A method of reading data from a semiconductor memory device, on which data has been written by a method of writing data on the semiconductor memory device, wherein the device comprises: a capacitor having two electrodes and a ferroelectric interposed between the electrodes; and a field effect transistor having source, drain and gate electrodes, and in which one of the two electrodes of the capacitor is connected to, or used in common as, the gate electrode of the transistor, while the other electrode of the capacitor is used as a control electrode, and in which a voltage is applied to the control electrode, thereby changing a polarization of the ferroelectric and eventually changing a channel resistance of the transistor so that the channel resistance can represent binary data depending on whether the resistance is high or low, wherein the writing method comprises: applying the voltage to the control electrode wherein the voltage applied to the control electrode falls within such a range as to turn OFF the transistor no matter whether data "1" or "0" is retained in the device after the voltage applied to the control electrode has been removed therefrom;

wherein if a threshold voltage of the transistor is positive, then a positive voltage, which is equal to or smaller than the threshold voltage of the transistor, is applied to the control electrode, and wherein if the threshold voltage of the transistor is negative, then a negative voltage, which is equal to or larger than the threshold voltage of the transistor, is applied to the control electrode.

6. The method of claim 5, wherein multiple semiconductor memory devices are arranged in matrix, each said memory device including: the capacitor having the two electrodes and the ferroelectric; the field effect transistor having the source, drain and gate electrodes; and a gate selecting transistor having source, drain and gate electrodes, wherein the drain and source electrodes of the field effect transistor are connected to a bit line and a source line, respectively, and wherein the control electrode of the memory device is connected to the source electrode of the gate selecting transistor, and wherein the gate and drain electrodes of the gate selecting transistor are connected to first and second word lines, respectively.

* * * * *

UNITED STATES PATENT AND TRADEMARK OFFICE
CERTIFICATE OF CORRECTION

PATENT NO.    : 6,438,021 B2
DATED         : August 20, 2002
INVENTOR(S)   : Yoshihisa Kato It is certified that error appears in the above-identified patent and that said Letters Patent is hereby corrected as shown below:

<u>Title page,</u>
Item [73], Assignee, delete "Matsushita Electronics Corporation" add
-- Matsushita Electric Industrial Co., Ltd. --.

Signed and Sealed this

Eighteenth Day of February, 2003

JAMES E. ROGAN
*Director of the United States Patent and Trademark Office*